(12) United States Patent
Green et al.

(10) Patent No.: US 10,756,952 B2
(45) Date of Patent: Aug. 25, 2020

(54) DETERMINING A STORAGE NETWORK PATH UTILIZING LOG DATA

(71) Applicant: International Business Machines Corporation, Armonk, NY (US)

(72) Inventors: David M. Green, Hillsborough, NC (US); Ryan Sullivan, Cary, NC (US); James E. Blue, Jr., Garner, NC (US)

(73) Assignee: International Business Machines Corporation, Armonk, NY (US)

( * ) Notice: Subject to any disclaimer, the term of this patent is extended or adjusted under 35 U.S.C. 154(b) by 142 days.

(21) Appl. No.: 15/993,433

(22) Filed: May 30, 2018

(65) Prior Publication Data
US 2019/0372829 A1 Dec. 5, 2019

(51) Int. Cl.
| | | |
|---|---|---|
| *H04L 12/24* | (2006.01) | |
| *H04L 12/26* | (2006.01) | |
| *H04L 29/08* | (2006.01) | |
| *G06F 15/16* | (2006.01) | |
| *H03M 7/30* | (2006.01) | |

(52) U.S. Cl.
CPC ........ *H04L 41/0654* (2013.01); *H04L 41/064* (2013.01); *H04L 41/065* (2013.01); *H04L 41/12* (2013.01); *H04L 43/045* (2013.01); *H04L 67/1097* (2013.01); *H03M 7/30* (2013.01)

(58) Field of Classification Search
USPC ................ 709/223, 203, 202, 226, 204, 217
See application file for complete search history.

(56) References Cited

U.S. PATENT DOCUMENTS

| | | | |
|---|---|---|---|
| 7,328,260 B1 | 2/2008 | Muthiyan et al. | |
| 8,019,849 B1 | 9/2011 | Lopilato et al. | |
| 9,171,470 B2* | 10/2015 | Woodings | G01S 5/0027 |
| 10,133,505 B1* | 11/2018 | LeCrone | G06F 3/0608 |
| 2005/0021723 A1 | 1/2005 | Saperia | |
| 2005/0243609 A1* | 11/2005 | Yang | G06F 3/0617 365/189.05 |
| 2008/0091555 A1* | 4/2008 | Heather | G06Q 30/0641 705/27.1 |
| 2009/0274063 A1* | 11/2009 | Guo | H04L 45/00 370/254 |
| 2011/0196924 A1* | 8/2011 | Hargarten | G06Q 30/02 709/204 |
| 2013/0297674 A1* | 11/2013 | Jain | G06Q 30/02 709/203 |
| 2014/0298486 A1* | 10/2014 | Robertson | G06F 21/10 726/28 |
| 2016/0180302 A1* | 6/2016 | Bagot, Jr. | G06Q 20/227 705/40 |

(Continued)

OTHER PUBLICATIONS

Gopisetty et al., "Evolution of storage management: Transforming raw data into information," IBM Journal of Research and Development, vol. 52, No. 4-5, Jul.-Sep. 2008, pp. 341-352.

*Primary Examiner* — Jude Jean Gilles
(74) *Attorney, Agent, or Firm* — Zilka-Kotab, P.C.

(57) ABSTRACT

A computer-implemented method according to one embodiment includes receiving log data from a component of a network, processing the log data to create processed log data, creating a component object, utilizing the processed log data, receiving an identification of a device connected to the network, determining a path within the network that is associated with the device, utilizing the component object, and returning the path.

20 Claims, 6 Drawing Sheets

(56) References Cited

U.S. PATENT DOCUMENTS

| | | | |
|---|---|---|---|
| 2016/0248642 A1* | 8/2016 | Rajasekar | G06F 11/3466 |
| 2016/0248792 A1* | 8/2016 | Tidwell | G06F 16/2455 |
| 2018/0075513 A1* | 3/2018 | Bastide | H04L 67/22 |
| 2018/0123733 A1* | 5/2018 | Yang | H04L 1/0043 |
| 2019/0244174 A1* | 8/2019 | Ogrinz | G06F 16/2272 |
| 2019/0244175 A1* | 8/2019 | Ogrinz | G06F 40/295 |

* cited by examiner

DETERMINING A STORAGE NETWORK PATH UTILIZING LOG DATA

BACKGROUND

The present invention relates to storage networks, and more specifically, this invention relates to determining and resolving issues within storage networks.

Storage Area Networks (SANs) are growing increasingly larger and more complex. As network speeds increase, problems on SANs may become more widespread and effects of any problems may become more damaging to customers. Current processes for finding issues involves independent, manual analysis of collected data. There is therefore a need for a single tool that can parse data from different devices, find relationships across the devices, and identify and resolve potential issues across the entire SAN.

SUMMARY

A computer-implemented method according to one embodiment includes receiving log data from a component of a network, processing the log data to create processed log data, creating a component object, utilizing the processed log data, receiving an identification of a device connected to the network, determining a path within the network that is associated with the device, utilizing the component object, and returning the path.

According to another embodiment, a computer program product for determining a storage network path utilizing log data comprises a computer readable storage medium having program instructions embodied therewith, where the computer readable storage medium is not a transitory signal per se, and where the program instructions are executable by a processor to cause the processor to perform a method comprising receiving log data from a component of a network, utilizing the processor, processing the log data to create processed log data, utilizing the processor, creating, utilizing the processor, a component object, utilizing the processed log data, receiving an identification of a device connected to the network, utilizing the processor, determining, utilizing the processor, a path within the network that is associated with the device, utilizing the component object, and returning the path, utilizing the processor.

A system according to another embodiment includes a processor, and logic integrated with the processor, executable by the processor, or integrated with and executable by the processor, where the logic is configured to receive log data from a component of a network, process the log data to create processed log data, create a component object, utilizing the processed log data, receive an identification of a device connected to the network, determine a path within the network that is associated with the device, utilizing the component object, and return the path.

Other aspects and embodiments of the present invention will become apparent from the following detailed description, which, when taken in conjunction with the drawings, illustrate by way of example the principles of the invention.

DETAILED DESCRIPTION

Figure 1:
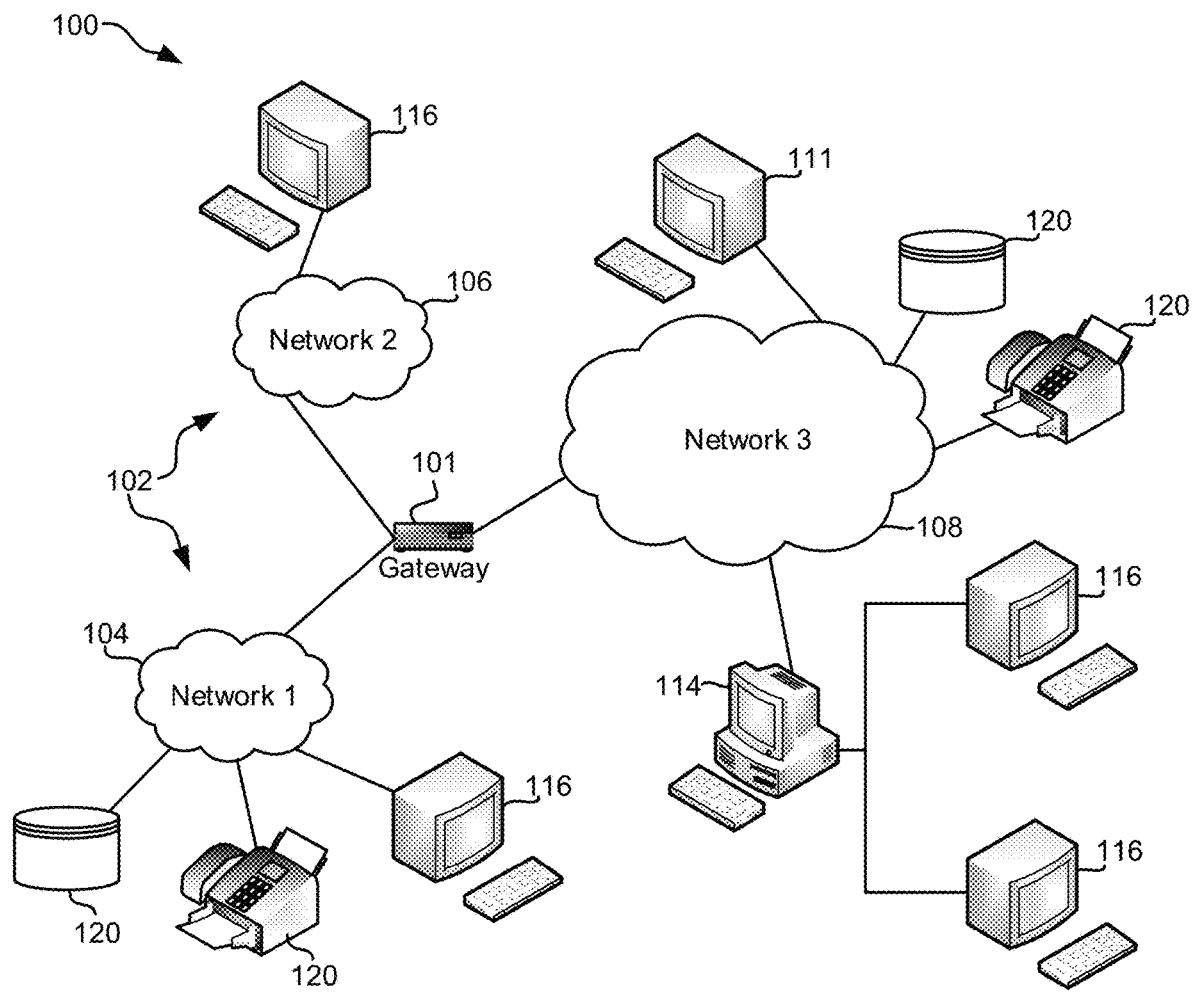
FIG. 1 illustrates a network architecture, in accordance with one embodiment.

The following description discloses several preferred embodiments of systems, methods and computer program products for determining a storage network path utilizing log data. Various embodiments provide a method to determine and analyze a network path between a host and storage, utilizing log data retrieved from components within the network.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "includes" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for determining a storage network path utilizing log data.

In one general embodiment, a computer-implemented method includes receiving log data from a component of a network, processing the log data to create processed log data, creating a component object, utilizing the processed log data, receiving an identification of a device connected to the network, determining a path within the network that is associated with the device, utilizing the component object, and returning the path.

In another general embodiment, a computer program product for determining a storage network path utilizing log data comprises a computer readable storage medium having program instructions embodied therewith, where the computer readable storage medium is not a transitory signal per se, and where the program instructions are executable by a processor to cause the processor to perform a method comprising receiving log data from a component of a network, utilizing the processor, processing the log data to create processed log data, utilizing the processor, creating, utilizing the processor, a component object, utilizing the processed log data, receiving an identification of a device connected to the network, utilizing the processor, determining, utilizing the processor, a path within the network that is associated with the device, utilizing the component object, and returning the path, utilizing the processor.

In another general embodiment, a system includes a processor, and logic integrated with the processor, executable by the processor, or integrated with and executable by the processor, where the logic is configured to receive log data from a component of a network, process the log data to create processed log data, create a component object, utilizing the processed log data, receive an identification of a device connected to the network, determine a path within the network that is associated with the device, utilizing the component object, and return the path.

FIG. 1 illustrates an architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. User devices 116 may also be connected directly through one of the networks 104, 106, 108. Such user devices 116 may include a desktop computer, lap-top computer, hand-held computer, printer or any other type of logic. It should be noted that a user device 111 may also be directly coupled to any of the networks, in one embodiment.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
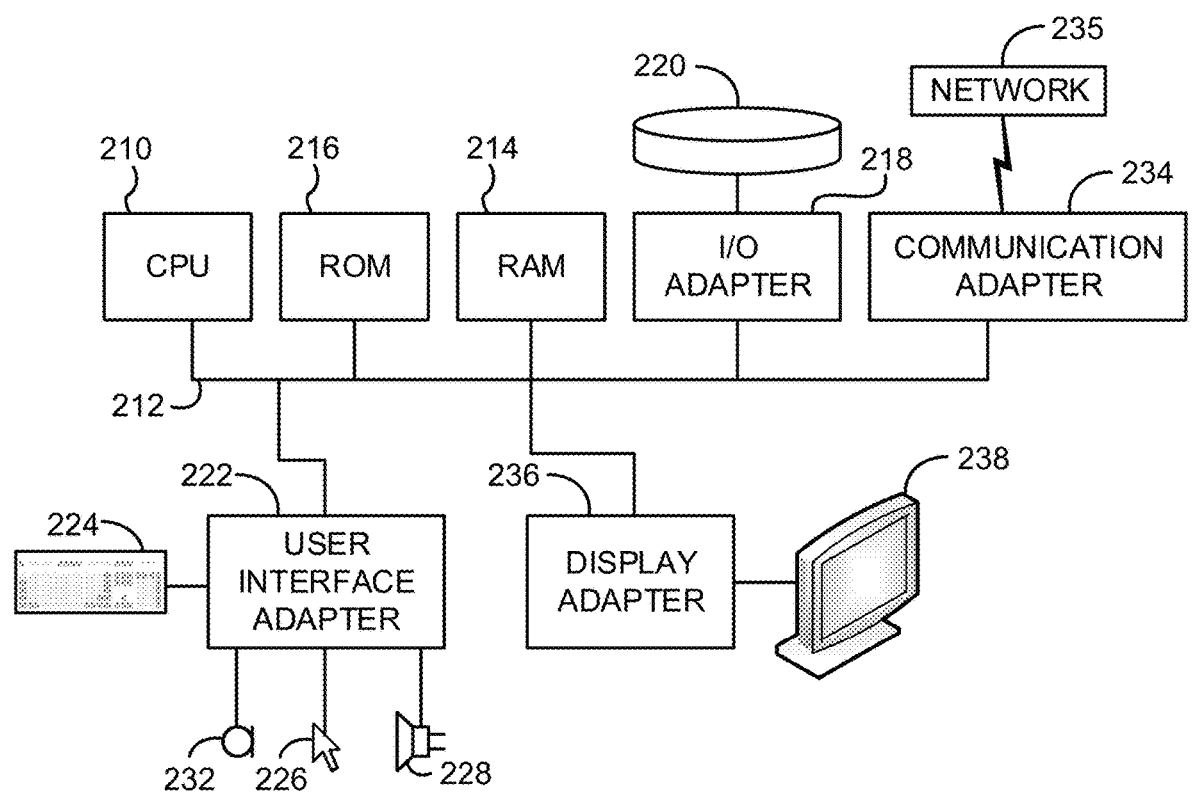
FIG. 2 shows a representative hardware environment that may be associated with the servers and/or clients of FIG. 1, in accordance with one embodiment.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an I/O adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred embodiment may also be implemented on platforms and operating systems other than those mentioned. A preferred embodiment may be written using XML, C, and/or C++ language, or other programming languages, along with an object oriented programming methodology. Object oriented programming (OOP), which has become increasingly used to develop complex applications, may be used.

Figure 3:
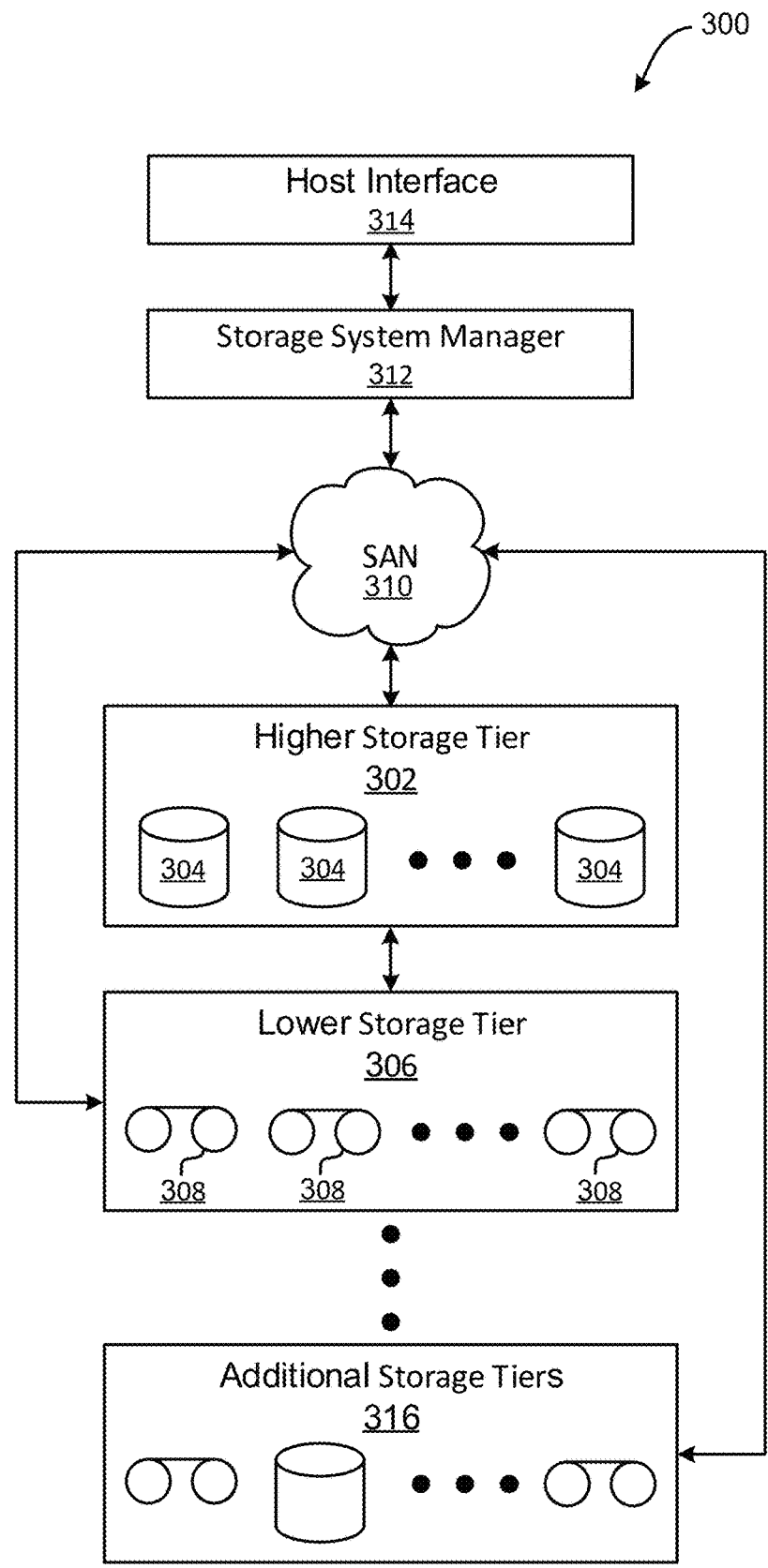
FIG. 3 illustrates a tiered data storage system in accordance with one embodiment.

Now referring to FIG. 3, a storage system 300 is shown according to one embodiment. Note that some of the elements shown in FIG. 3 may be implemented as hardware and/or software, according to various embodiments. The storage system 300 may include a storage system manager 312 for communicating with a plurality of media on at least one higher storage tier 302 and at least one lower storage tier 306. The higher storage tier(s) 302 preferably may include one or more random access and/or direct access media 304, such as hard disks in hard disk drives (HDDs), nonvolatile memory (NVM), solid state memory in solid state drives (SSDs), flash memory, SSD arrays, flash memory arrays, etc., and/or others noted herein or known in the art. The lower storage tier(s) 306 may preferably include one or more lower performing storage media 308, including sequential access media such as magnetic tape in tape drives and/or optical media, slower accessing HDDs, slower accessing SSDs, etc., and/or others noted herein or known in the art. One or more additional storage tiers 316 may include any combination of storage memory media as desired by a designer of the system 300. Also, any of the higher storage tiers 302 and/or the lower storage tiers 306 may include some combination of storage devices and/or storage media.

The storage system manager 312 may communicate with the storage media 304, 308 on the higher storage tier(s) 302 and lower storage tier(s) 306 through a network 310, such as a storage area network (SAN), as shown in FIG. 3, or some other suitable network type. The storage system manager 312 may also communicate with one or more host systems (not shown) through a host interface 314, which may or may not be a part of the storage system manager 312. The storage system manager 312 and/or any other component of the storage system 300 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 300 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 302, may include a majority of SSD storage media for storing data in a higher performing storage environment, and remaining storage tiers, including lower storage tier 306 and additional storage tiers 316 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 302, while data not having one of these attributes may be stored to the additional storage tiers 316, including lower storage tier 306. Of course, one of skill in the art, upon reading the present descriptions, may devise many other combinations of storage media types to implement into different storage schemes, according to the embodiments presented herein.

According to some embodiments, the storage system (such as 300) may include logic configured to receive a request to open a data set, logic configured to determine if the requested data set is stored to a lower storage tier 306 of a tiered data storage system 300 in multiple associated portions, logic configured to move each associated portion of the requested data set to a higher storage tier 302 of the tiered data storage system 300, and logic configured to assemble the requested data set on the higher storage tier 302 of the tiered data storage system 300 from the associated portions.

Of course, this logic may be implemented as a method on any device and/or system or as a computer program product, according to various embodiments.

Figure 4:
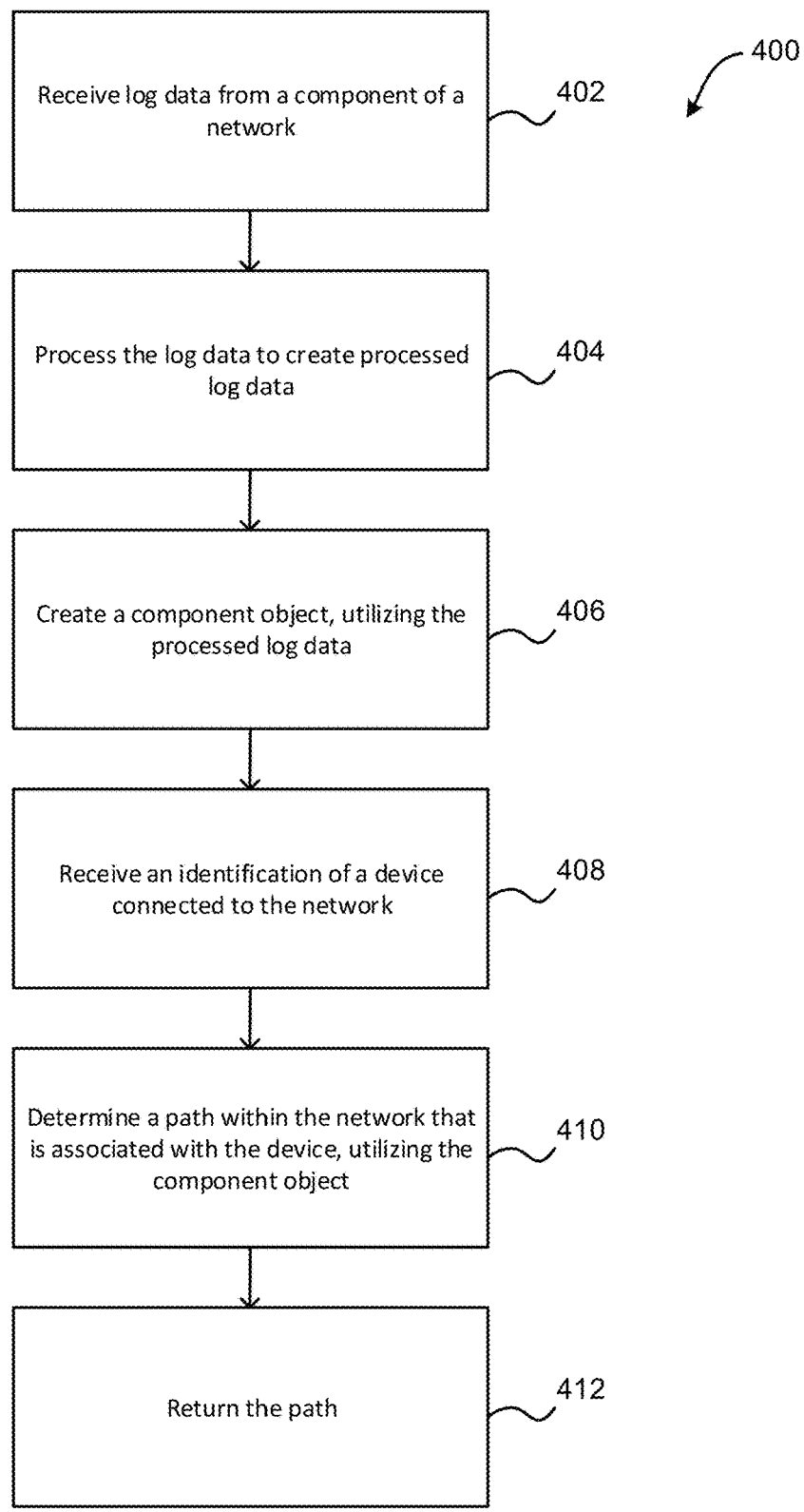
FIG. 4 illustrates a method for determining a storage network path utilizing log data, in accordance with one embodiment.

Now referring to FIG. 4, a flowchart of a method 400 is shown according to one embodiment. The method 400 may be performed in accordance with the present invention in any of the environments depicted in FIGS. 1-3 and 6, among others, in various embodiments. Of course, more or less operations than those specifically described in FIG. 4 may be included in method 400, as would be understood by one of skill in the art upon reading the present descriptions.

Each of the steps of the method 400 may be performed by any suitable component of the operating environment. For example, in various embodiments, the method 400 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 400. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 4, method 400 may initiate with operation 402, where log data from a component of a network is received. In one embodiment, the log data may include one or more files. In another embodiment, the log data may be created by the component of the network. For example, the log data may be created by the component in response to a request sent to the component of the network.

Additionally, in one embodiment, the component of the network may include a network switch. For example, the network switch may include a hardware computing device that connects one or more devices together within a network. In another example, the network switch may use packet switching to perform one or more of receiving data from a source, processing the received data, and forwarding the processed data to a destination.

Further, in one embodiment, the log data may include switch log data. For example, the switch log data may include details about the network switch (e.g., one or more components or other devices connected to the network switch, one or more components or other devices connected to those components or devices, one or more resources of the network switch, other network components (e.g., storage, other switches, etc.) connected to the network switch, hardware/software assets/resources of the network switch, etc.). In another example, the switch log data may include details of one or more hardware, software, and/or network issues experienced by the network switch.

For instance, the switch log data may include one or more port and/or switch error statistics, an identification of an inability to send data to another component (e.g., since the other component was full), an indication of an inability to send data by the network switch due to a backlog within the network switch, a number of throwaway/dropped frames/packets sent by the network switch, etc. The switch log data may also include an indication of all devices connected to the switch within the network, an indication of all ports that the devices are on, an indication of one or more problems with one or more ports, an indication of historical problems with one or more ports, etc.

Further still, in one embodiment, the switch log data may include timestamp data. For example, one or more of the switch log data entries may have an associated time and date. In another embodiment, the switch log data may include an amount of data able to be sent by the network switch at a predetermined period in time (e.g., the time the request for log data was sent, etc.). In this way, the switch log data may include an identification of one or more occurrences happening at the network switch when the switch log data is requested.

Also, in one embodiment, the component of the network may include a storage virtualization controller (SVC). For example, the SVC may be located between a storage device and a host within the network. In another example, the SVC may receive communications from the host, convert them to communications that are understandable by the storage device, and forward them on to the storage device. In yet another example, the SVC may receive a response from the storage device, and may forward the response on to the host. In this way, the SVC may create a storage virtualization for the host.

In addition, in one embodiment, the log data may include SVC log data. For example, the SVC log data may identify one or more components connected to the SVC within the network. In another example, the SVC log data may identify one or more storage devices connected to the SVC within the network.

Furthermore, in one embodiment, the component of the network may include a storage device. For example, the storage device may include one or more storage disks and/or storage disk arrays, one or more tape drives and/or tape libraries, one or more solid state drives and or solid-state drive arrays, one or more backup storage devices, etc. In another embodiment, the network may include a fiber-channel storage area network (SAN). For example, the network may include a distributed network of a plurality of storage devices.

Further still, in one embodiment, data may be transferred, stored, retrieved, etc. within the SAN utilizing one or more network switches. In another embodiment, the network may provide, to one or more hosts, access to one or more storage devices within the network. In yet another embodiment, the network may enhance the storage devices so that the storage devices appear to an operating system of a host as locally attached devices.

Also, in one embodiment, the network may be called a fabric, where the SAN fabric includes the network of switches, SVCs, storage devices, and other components that implement the SAN.

Additionally, method 400 may proceed with operation 404, where the log data is processed to create processed log data. In one embodiment, processing the log data may include determining whether the log data is compressed. In another embodiment, processing the log data may include determining a type of compression used to compress the log data, in response to determining that the log data is compressed. In yet another embodiment, processing the log data may include decompressing compressed log data to obtain decompressed log data, in response to determining that the log data is compressed. For example, the compressed log data may be decompressed based on the determined type of compression used to compress the log data.

Further, in one embodiment, processing the log data may include determining an entity associated with the log data. For example, the entity may include a vendor and/or manufacturer associated with the creation of the log data. In another embodiment, processing the log data may be performed utilizing one or more routines specific to the determined entity. For example, upon determining that the log data is associated with a predetermined vendor, one or more vendor-specific processes may be used to parse and/or process the log data. In another example, the one or more vendor-specific processes may be retrieved on demand from a remote or local repository. In yet another example, the one or more vendor-specific processes may be predetermined and/or stored before the log data is received.

Table 1 illustrates exemplary vendor-specific processes associated with a first vendor that retrieve associated data from a log created by a component specific to the first vendor, in accordance with one embodiment. Of course, it should be noted that the exemplary processes shown in Table 1 are set forth for illustrative purposes only, and thus should not be construed as limiting in any manner.

TABLE 1

| Description of Log Data | Command/Keyword |
|---|---|
| Firmware Version | "version" |
| List of ports and attached devices | "switchshow" |
| License Information | "licenseidshow" |
| List of Modules in the switch | "slotshow" |
| Model Number of switch | "switchshow" |
| Switch Chassis Information | "chassisshow" |
| Device Zoning | "cfgshow" |
| List of Switches in Fabric | "fabricshow" |
| List of ISLs to Other Switches | "islshow" |
| List of Trunked ISLs | "trunkshow" |
| List of Devices in Name Server on local switch | "nsshow" |

TABLE 1-continued

| Description of Log Data | Command/Keyword |
|---|---|
| List of Devices in Name Server on fabric | "nsallshow" |
| List of Routing Information between switches | "lsdbshow" |
| List of Devices Logged into each switch port | "portloginshow" |
| List of FCIP Tunnels | Collect Ethernet Port Listing |
| FC Routing IFCIP) Information | "fcrfabricshow", fcrdbgportshow" |

Table 2 illustrates exemplary vendor-specific processes associated with a second vendor that retrieve associated data from a log created by a component specific to the second vendor, in accordance with one embodiment. Of course, it should be noted that the exemplary processes shown in Table 2 are set forth for illustrative purposes only, and thus should not be construed as limiting in any manner.

TABLE 2

| Description of Log Data | Command/Keyword |
|---|---|
| Collect main show tech support file | show tech-support |
| Collect switch name | show switchname |
| Collect configuration on management network interface | show interface mgmt0 |
| collect current switch firmware version | show version |
| Collect HW information including serial number | show sprom backplane 1 |
| Collect switch time | show clock |
| List Modules in the switch | show module |
| List VSANs on the switch | show vsan |
| List Switch Ports grouped by VSAN | show vsan membership |
| List devices logged into the switch | show flogi database |
| List Zoning Information for each VSAN | show zoneset active vsan 1-4093 |
| List switch ports on the switch | show interface |
| List FCIP Configuration | show fcip profile all |
| List connections to other switches | show topology |
| List domain IDs of switches in each VSAN | show fcdomain domain-list |
| List all switches in fabric | show fcs ie |
| List all commands run by administrators | show accounting log |
| List event log on the switch | show logging log |
| List machine event | show logging nvram |
| List fabric switch routing table | show fspf database |
| List IP stats for Gigabit Ethernet Ports | show ips stats tcp all |
| List IVR configuration | show ivr |
| List IVR VSAN configuration | show ivr vsan-topology |
| List devices being exported via IVR | show ivr internal device-list |
| List name server database for fabric | show fcns database detail vsan 1-4093 |
| List local alisases for fabric devices | show device-alias database |
| List aliases for fabric devices | show fcalias vsan 1-4093 |
| List any dropped packets on the switch per port | show internal packet-flow dropped |

Further still, in one embodiment, processing the log data may include identifying all details stored within the log data, formatting all details stored within the log data, storing all formatted details associated with the log data, etc. In another embodiment, the processed log data may include the formatted details of the component, the one or more hardware, software, and/or network issues experienced by the component, one or more timestamps, etc. In this way, the log data may be converted into a uniform format (e.g., the processed log data, etc.) for further actions and analysis.

Also, method 400 may proceed with operation 406, where a component object is created, utilizing the processed log data. In one embodiment, the component object may include a region of storage that contains a group of values associated with the component. In another embodiment, the component object may have a predetermined data type. In yet another embodiment, the component object may be created during the processing of the log data.

In addition, in one embodiment, the component object may store the processed log data. For example, the component object may be empty when created, and the processed log data may be added to the component object. In another embodiment, the component object may include an entity-specific object (e.g., a vendor-specific object, etc.). In yet another embodiment, the component object may be stored in association with an identifier of the network.

Furthermore, in one embodiment, the component object may be stored in association with additional component objects. For example, each of the additional component objects may include log data associated with additional components within the network. In another embodiment, a representation of the network may be created, and the component object may be associated with the representation of the network, and the component object and associated representation may be stored.

In yet another embodiment, the component object may be added to an existing representation of the network and stored, based on an analysis of the component object. For example, the component object may be analyzed to determine an additional component that the component is connected to within the network. In another example, stored component objects may be searched for the additional component. In still another example, if an additional component object is identified for the additional component, a network representation associated with the additional component object may be identified, and the component object may be associated with that network representation.

Further still, in one embodiment, log data from each of a plurality of components may be received, and component objects may be created for each of the plurality of components, utilizing the associated log data. In another embodiment, each of the plurality of components may be associated with a single network representation. In this way, the single network representation may store component objects for each component within the network, where the component objects include processed data from the log data of the associated component.

Also, in one embodiment, the single network representation may be displayed. For example, all components and connectivity between components may be displayed in a diagram. In another example, the diagram may display how data is transmitted between the components of the network.

In addition, method 400 may proceed with operation 408, where an identification of a device connected to the network is received. In one embodiment, the device may include a host connected to the network. For example, the host may include a computing device such as a personal computer, a server, etc. In another embodiment, the device may include a host connected to one or more storage devices via the network. For example, the host may access the one or more storage devices via the network.

Furthermore, in one embodiment, the identification of the device may be received as a query. For example, a user of a host may be experiencing one or more issues with the host, and may submit a query including an identification of the host.

Further still, method 400 may proceed with operation 410, where a path within the network that is associated with the device is determined, utilizing the component object. In one embodiment, the path within the network may include a path between the host and a storage device within the network. For example, the path may include one or more switches, one or more SVCs, one or more storage devices, etc. In another embodiment, determining the path may include identifying one or more components directly and/or indirectly connected to the device within the network.

Also, in one embodiment, stored component objects for all components within the network may be identified (e.g., by determining all stored component objects associated with the network representation, etc.). For example, the stored component objects may be analyzed to identify all interconnections between components within the network. In another embodiment, stored component objects for a subset of all components within the network may be identified. For example, the stored component objects for the subset may be analyzed to derive and identify all interconnections between components within the network. In yet another embodiment, utilizing the stored component objects (or the subset of the storage component objects) and their identified interconnections within the network, an end-to-end path within the network between the host and a storage device may be determined.

Additionally, method 400 may proceed with operation 410, where the path is returned. In one embodiment, the determined path may be presented to the requesting entity. In another embodiment, the determined path may be presented visually (e.g., as a series of linked nodes between a host node and one or more storage device nodes, etc.). In yet another embodiment, all nodes within the path having component objects with processed log data may be visually identified.

Further, in one embodiment, all nodes within the path having component objects without processed log data may be visually identified. For example, one or more notifications may be displayed to request log data for the component objects that do not contained processed log data. This log data may be identified as necessary to further diagnose issues within the network.

Further still, in one embodiment, one or more issues may be determined within the returned path, utilizing the stored component objects for the nodes within the path. In another embodiment, the one or more issues may be resolved, utilizing the utilizing the stored component objects for the nodes within the path. In yet another embodiment, the receiving, processing, creating, determining, and returning may be performed by an analyzer module. For example, the analyzer module may be located outside of the network or within the network. In another example, the analyzer module may include a fabric analyzer tool.

In this way, an end-to-end network path visualization may be created (e.g., from a host to network storage). This may allow for viewing the network as a whole, as well as drilling down into details of individual network components, in order to more easily/effectively determine a cause and solution of network issues. Additionally, network path identification may be inferred based on information from only a subset of switches within the network. Further, objects with no associated data (e.g. switch data) may be identified within the network, and such associated data may be requested in order to further diagnose network issues and/or have a complete understanding of a path within the network. This may provide additional insight into a layout of a network, and paths within that network, to assist in tracing down network issues.

Figure 5:
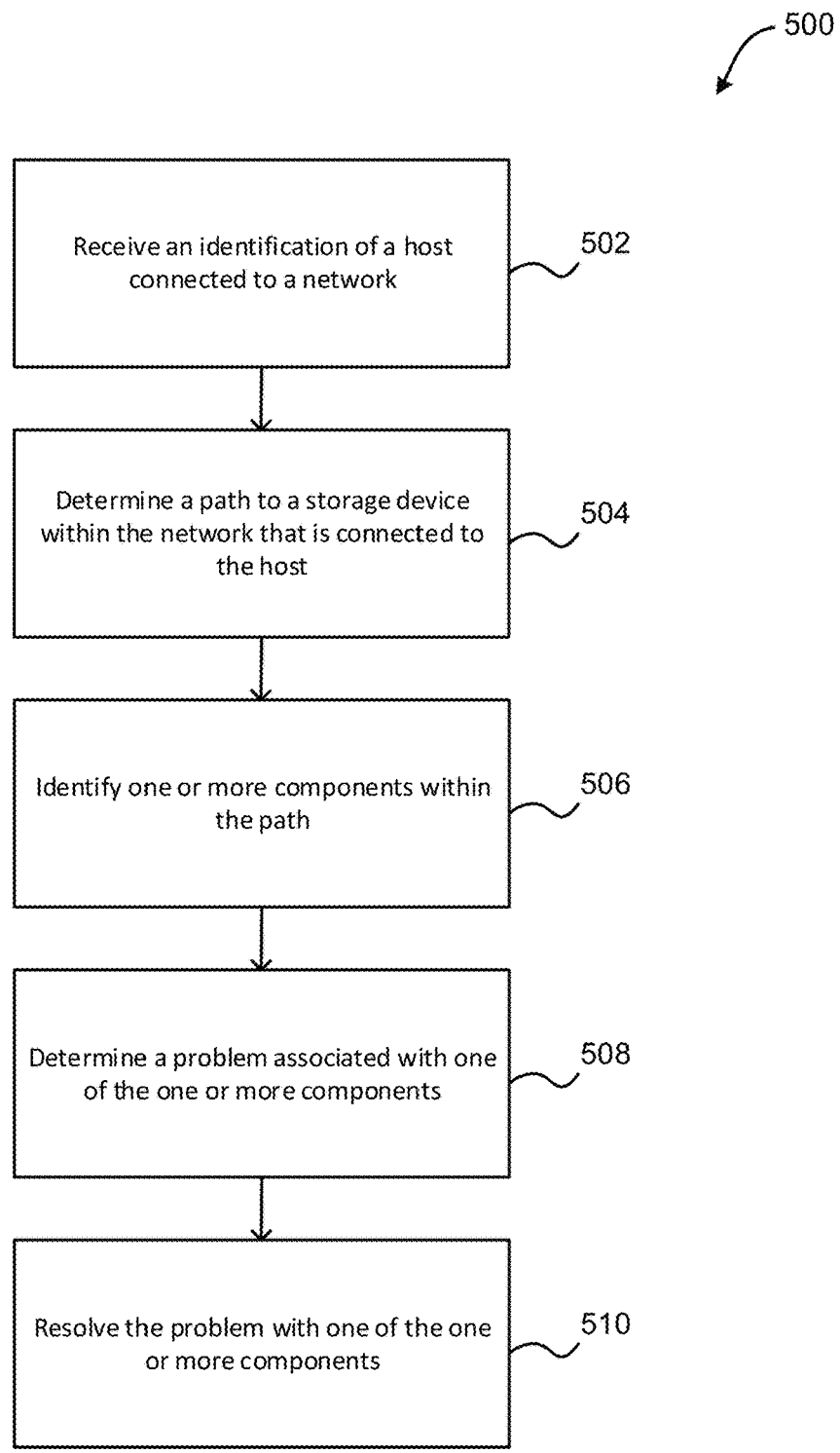
FIG. 5 illustrates a method for resolving a problem within a network, in accordance with one embodiment.

Now referring to FIG. 5, a flowchart of a method 500 for resolving a problem within a network is shown according to one embodiment. The method 500 may be performed in accordance with the present invention in any of the environments depicted in FIGS. 1-3 and 6, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various embodiments, the method 500 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 5, method 500 may initiate with operation 502, where an identification of a host connected to a network is received. In one embodiment, the host may access a storage device via the network. For example, one or more switches, SVCs, etc. may connect the host to the storage device within the network. In another embodiment, the identification may be received in response to the host experiencing one or more issues. For example, the host may be unable to receive data from the one or more storage devices via the network, access to the one or more storage devices by the host may be slower than a predetermined threshold, etc.

Additionally, in one embodiment, log data may be received with the identification of the host. For example, the log data may be created by one or more components within the network (e.g., one or more switches, SVCs, storage devices, etc.).

Further, method 500 may proceed with operation 504, where a path to a storage device within the network that is connected to the host is determined. In one embodiment, received log data may be processed to create processed log data, and the processed log data may be used to create one or more component objects. In another embodiment, the path may be determined, utilizing the one or more component objects.

Further still, in one embodiment, the path may include an identification of a route from the host to the storage device within the network. For example, the one or more component objects may be used to identify a route from the host to the storage device within the network. In another embodiment, the path may include a plurality of components.

Also, method 500 may proceed with operation 506, where one or more components within the path are identified. In one embodiment, the path may include an identification of all components between the host and the storage device within the network that are used to communicate data between the host and the storage device within the network. In another embodiment, these components may be identified using the processed log data stored within the one or more component objects.

In addition, method 500 may proceed with operation 508, where a problem associated with one of the one or more components is determined. In one embodiment, the problem may include one or more hardware and/or software issues with one or more of the components. For example, the problem may include an existence of outdated firmware within a component, a malfunctioning component, a software and/or hardware crash within the component, etc.

Furthermore, in one embodiment, the problem may include a problem with a physical link between one or more components (e.g., a bad and/or damaged communications cable, etc.). In another embodiment, the processed log data stored within the one or more component objects for components within the path may be analyzed. For example, the processed log data may be used to check for problems between components within the path.

Further still, in one embodiment, the analyzing may include searching for one or more predetermined patterns within the processed log data, where the patterns are associated with the problem. For example, processed log data may be analyzed for components that are directly connected to each other within the path, in order to determine whether a problem exists between those components. In another embodiment, the analyzing may include searching for predetermined data (e.g., one or more error messages) within the processed log data, where the predetermined data is associated with the problem. For example, the predetermined data may include an indication of network congestion, frames being discarded between components, physical link problems between components, not enough links between components, etc. The predetermined data may also be associated with one or more components. For example, the predetermined data may include an associated identifier of the one or more components to which the predetermined data is connected.

Also, in one embodiment, the analyzing of the processed log data may include analyzing a timing of one or more statistics and/or timestamps as well as a number/severity of data loss indicators (e.g., error messages, etc.). In another embodiment, the analyzing may include comparing the identified timing/number/severity to one or more thresholds. In yet another embodiment, a problem may be determined to exist in response to determining that the timing/number/severity exceeds one or more thresholds (e.g., more than a predetermined number of error messages over a predetermined time period, etc.). The statistics and timestamps may also be associated with one or more components. For example, the statistics and timestamps may include an associated identifier of the one or more components to which the predetermined data is connected.

Additionally, in one embodiment, in response to determining the problem, the one or more components associated with the problem may be flagged as being problematic. For example, this may include adding metadata to the component objects for the one or more components determined to be associated with the problem. In another example, the portions of the processed log data that indicate the problem may be flagged within the one or more associated component objects as well.

Further, method 500 may proceed with operation 510, where the problem with one of the one or more components is resolved. In one embodiment, resolving the problem may include identifying a resolution to the problem. For example, predefined resolutions may be mapped to predefined problems, and the mapping may be stored (e.g., in a database, etc.). In another example, the determined problem may be referenced against the mapping to determine a predefined solution that is mapped to the determined problem.

Further still, in one embodiment, resolving the problem may include presenting the solution to one or more entities (e.g., one or more users that originally submitted the log data and the identification of the host, etc.). For example, one or more suggestions for solving the problem may be identified and presented to one or more users. In another example, one or more alerts may be sent to one or more users. In yet another example, one or more steps to diagnose and/or fix hardware problems may be recommended to one or more users. In another embodiment, resolving the problem may include automatically implementing the resolution to the problem. For example, a repair module may be triggered to implement a predetermined solution to the problem (e.g., by running software (e.g. a firmware update), restarting a switch, etc.) in order to help automatically resolve the problem.

In this way, utilizing an identified network path, as well as log data associated with components within the path, a problem with one or more components within the path may be identified, and one or more predetermined resolution actions may be implemented to help solve the problem within the network. This may improve a functioning of the network path, which may in turn improve the functioning of one or more components within the network path, as well as a functioning of a host connected to a storage device via the network path.

Fabric Analyzer Design Specification

Overview

In one embodiment, a tool may parse vendor-specific fiber-channel switch logs and provide a mechanism for viewing and saving the parsed data. The tool may include the ability to parse data from additional vendor-specific SAN components. Current tools are focused on a different mission than solution support and as such are focused on treating a fiber-channel switch as a single entity. These tools do not analyze data across switches and are unable to provide analysis of end-to-end connections through a SAN from a host port to a storage port. The Fabric Analyzer Tool may take a collection of switch logs and may provide analysis of individual logs as well as relate the logs to parsed logs of other switches in the same fabric.

The tool may also provide congestion detection, and may detect configurations that are not within a predetermined best practice.

Environment

The tool may run on a system located within a storage network, or located outside of a storage network.

Architecture

The tool may be implemented using abstract classes for all of the SAN-related objects that are common to vendor-specific SANS. Physical objects such as switches, switch modules and ports may all be components of both types of switches and carry many common properties. Logical constructs such as a zoneset and a name server database may be equally common across switch brands. Abstract classes may be written that have methods and attributes common to both types of switches. The classes for each specific brand switch may then either inherit or implement the methods as needed. Any constructs that are brand-specific may be implemented in the brand-specific subclasses of the abstract class.

An example of a method that may be inherited by one of the subclasses is a GetSwitchName( ) method. Vendor-specific switches may have a switch name attribute and the method for accessing it may be the same. For an abstract method that will be implemented in a subclass, the existing Init( ) method for a vendor-specific switch object may start the parsing of the vendor-specific switch log and may load all of the parsed data into a switch object. This method may be moved to the Abstract Switch Class and implementation may be left to each of the vendor-specific classes.

Exemplary Query Result Form

In one embodiment, a result of a query may be provided in the zoneset of a particular world-wide port name (WWPN) after a switch log has been parsed. The result may include the WWPNs and/or aliases of all the members of each zone that the WWPN is a member of. A diagram may be produced showing the map through the fabric.

Figure 6:
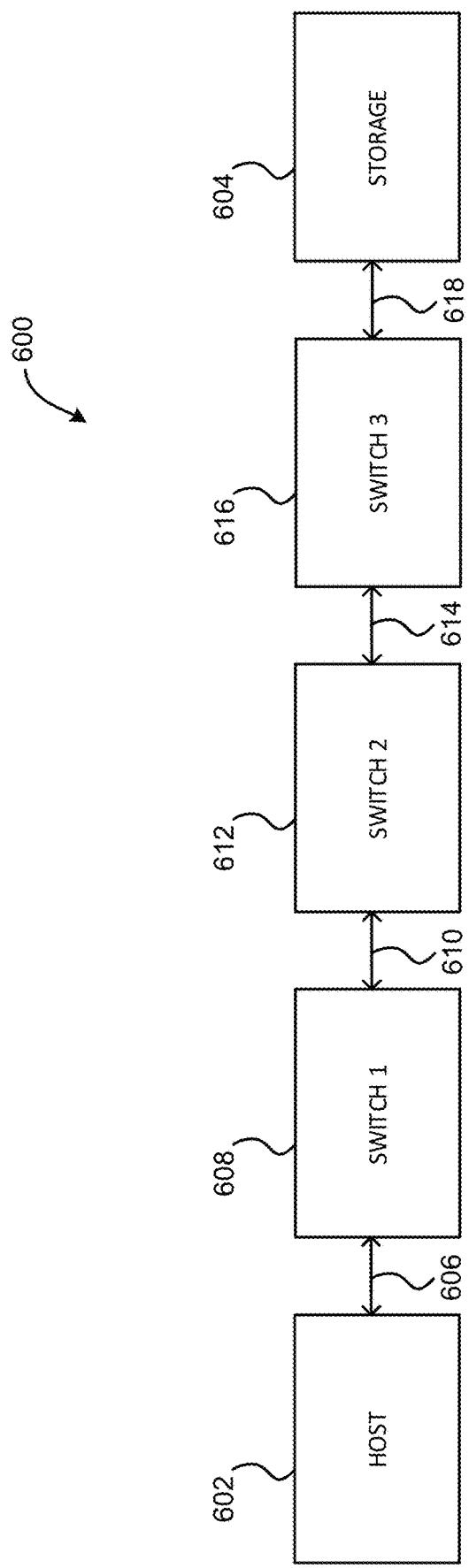
FIG. 6 illustrates an exemplary network path between a host and a storage device, in accordance with one embodiment.

FIG. 6 illustrates an exemplary network path 600 between a host 602 and a storage device 604. In one embodiment, the exemplary network path 600 may be displayed to the user as a query result, in response to the query. As shown, the network path 600 includes a first connection 606 between the host 602 and a first switch, a second connection 610 between the first switch 608 and a second switch 612, a third connection 614 between the second switch 612 and a third switch 616, and a fourth connection 618 between the third switch 616 and the storage device 604.

In one embodiment, the exemplary network path 600 may be created utilizing received log data. For example, log data may be received from one or more of the first switch 608, the second switch 612, the third switch 616, and the storage device 604. This log data may be processed to create processed log data, and component objects may be created for the first switch 608, the second switch 612, the third switch 616, and the storage device 604, utilizing the processed log data. The component objects may also store processed log data that is associated with the component. The second connection 610, the third connection 614, and the fourth connection 618 may also be identified utilizing the processed log data, and may be stored in association with the component objects.

Additionally, in one embodiment, a request may be received to identify any network problems between the host 602 and the storage device 604. In response to the request, the log data stored within the component objects for the first switch 608, the second switch 612, the third switch 616, and the storage device 604 may be analyzed and compared to one or more predetermined patterns and/or thresholds in order to identify problems with one or more of the first switch 608, the second switch 612, the third switch 616, and the storage device 604. Additionally, the log data stored within the component objects for the first switch 608, the second switch 612, the third switch 616, and the storage device 604 may be analyzed and compared to one or more predetermined patterns and/or thresholds in order to identify problems with one or more of the second connection 610, the third connection 614, and the fourth connection 618.

Further, in one embodiment, solutions to the identified problems may be determined by cross-referencing a description of the problems to mapped solutions within a database. In another embodiment, components and/or connections for which network problems have been determined may be presented. For example, a diagram may be output that illustrates the network path 600 between the host 602 and the storage device 604. If, for example, the log data indicates that a network problem exists with the second switch 612, the second connection 610, and the third connection 614, the second switch 612, the second connection 610, and the third connection 614 may be highlighted or otherwise emphasized within the diagram. Additionally, upon a selection of the highlighted components within the diagram, one or more solutions for resolving the associated problem may be presented. In yet another embodiment, the one or more solutions may be automatically implemented within the network.

In this way, a comprehensive visualization of a layout of the network path 600 may be presented, along with a detailed identification of problematic components within the network path 600.

Exemplary Execution Steps

In one embodiment, after a user enters a PMR number and clicks the 'Load PMR' button to fetch a PMR from Ecurep:

- EcurepFunctions.GetAllPMRFiles( ) is called to fetch the PMR files from Ecurep and Dump Decoder (if there are SVC snaps). Arguments are the PMR number and an Event Handler to list the files and let the user select which file(s) to parse. The Event Handler is called ShowPMRFiles
- GetAllPMRFiles( ) launches the login window to Ecurep with another function called HandlePMRFilesCallback. This function retrieves the Ecurep files and SVC files (if any) and returns the results to ShowPMRFiles( )
- ShowPMRFiles( ) opens a window that is a check list of Ecurep files and SVC Cluster snaps. The user selects which files to process and clicks the process button. The process button has an event handler called LoadPMRFiles( )
- LoadPMRFiles( ) takes the list of checked items and checks to see if the switch logs selected were previously downloaded, if not it downloads them. It always downloads the SVC XML due to the way the XML filenames are created.
- After the download is complete LoadPMRFiles( ) reports back that the download is complete.
- ProcessFolders( ) is called to start processing the data.
- ProcessFolders( ) creates a Background Worker thread where the thread that does the work is called ProcessFolders_DoWork( )
- ProcessFolders_DoWork( ) processes the selected files in the following manner:
  - Switch logs are extracted. For each extracted set of logs:
    - All switch logs are processed to create a list of switch objects with basic properties of name, IP, model type and WWN. Part of the process is detecting whether the data collection is Cisco or Brocade, and creating the appropriate switch type
    - Each switch is then further processed for switch ports, virtual fabrics and other switch-specific information as well as some of the fabric data
    - All switches are finally processed for name server, fabric detection and if the switch is a router, the fiber-channel routing information. Switches are placed in the appropriate SAN Fabric. If they are not a member of an existing fabric, a new fabric is created.
    - The parsing may be done in this manner to ensure the same switch object references are used across each switch log parsed, and that SAN Fabric detection is accurate, especially when FC Routing (IVR or vendor-specific LSAN Zoning) is used.
    - Any SVC configuration files are parsed. The data parsed out of the Storwize cluster is used to update the Name Server entries in all of the switch fabrics for the name server entries where the WWPN matches an SVC port WWPN. Current data parsed is SVC Cluster Name and SVC node name.

Once parsing is complete, control may be returned to the user so that the user can browse the parsed data and/or search for specific data. The parsed switches are added to the list of switches, detected SAN fabrics are added to the Fabric List view and any Storwize clusters are added to the SVC Cluster view.

Fabric Analyzer Fabric Diagram View Model Design

Fabric Analyzer diagrams may contain some combination of three items:

- SwitchThumb—represents a SAN Switch
- DeviceThumb—represents a non-switch device
- Path—a link between two Thumbs SwitchThumbs currently have properties for Switch Name and DomainID both bound to the relevant properties on a SwitchViewModel instance. SwitchThumbs are also colored by a VisibilityConverter called SwitchThumbColor. This converter is bound to the HaveLogFile( ) Boolean of the switch view model. Switches that do not have log files may be colored red in a displayed diagram.

Any additional properties to display for SwitchThumbs may be added to the SwitchViewModel class. Corresponding TextBoxes with the appropriate bindings may be added to the SwitchGridTemplate in the FabricDiagram.XAML file.

DeviceThumbs may have properties for a type, switch port, device WWPN, SVC Cluster Name and SVC Node Name. These are tied to fields in the PortResult instance that is a private property of a DeviceThumb instance. Device thumbs are currently colored based on the type—SVC, DS8000, XIV or Flash. A color converter called DeviceThumbColor sets the appropriate color. All text boxes the switch port and device WWPN are bound to a VisibilityConverter that checks for null value for the appropriate property. If the value is null, the text box is not displayed.

Any additional properties to display for Devicethumbs may be added to the FCNSEntry and PortResult classes. Corresponding text boxes with appropriate bindings may be added to the DeviceGridTemplate in a FabricDiagram.xaml file.

In this way, a network analyzer may be cross-vendor (e.g., it may parse all vendor-specific switch data, etc.). Additionally, switch data may be parsed and organized into a fabric. If switch data from switches in multiple fabrics is parsed, the analyzer may detect this and organize the switch data by fabric. The analyzer may also parse data from additional SAN devices such as a SAN Volume Controller (SVC).

Additionally, a user may use one tool to parse data from multiple different vendor-specific switches, and may parse data from the SAN Volume Controller. Since the data is organized by fabric, a user may more quickly trace a connection between two devices across a fabric.

In one embodiment, switch data from a first vendor may be collected in a large flat text file. Switch data from a second vendor may be collected in a compressed file which is in turn made up of a number of compressed files. Although the data files from each brand of switch are different formats, they may both consist of a series of commands which are included in the files.

The analyzer may open these files, detect the vendor of the file creator, then using a pre-defined list of commands for the detected vendor, the analyzer may find those commands and parse out the relevant data from that section of the file. Additional functionality may be easily added to the program by adding new commands to the appropriate list and providing the necessary text parsing algorithms to collect the new data. Parsed data may be stored in a collection of objects that represent a SAN. Also, the analyzer may automatically detect whether switches are members of an existing fabric, or a new one.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer-implemented method, comprising:
receiving log data from a component of a network;
processing the log data to create processed log data, including parsing the log data utilizing a vendor-specific process in response to determining that the log data is associated with the vendor;
creating a component object, utilizing the processed log data;
adding the component object to a representation of the network;
receiving an identification of a device connected to the network;
determining a path within the network that is associated with the device, utilizing the representation of the network including the component object; and
returning the path.

2. The computer-implemented method of claim 1, wherein a plurality of components are processed to create a plurality of component objects, the plurality of components including:
a network switch,
a storage virtualization controller, and
a storage device.

3. The computer-implemented method of claim 1, wherein the component object is stored in association with:
an identifier of the network, and
additional component objects.

4. The computer-implemented method of claim 1, wherein the log data includes timestamp data and an amount of data able to be sent by the component of the network at a predetermined period in time.

5. The computer-implemented method of claim 1, wherein the network includes a fiber-channel storage area network (SAN).

6. The computer-implemented method of claim 1, wherein processing the log data further includes:
determining whether the log data is compressed,
determining a type of compression used to compress the log data, in response to determining that the log data is compressed, and
decompressing compressed log data to obtain decompressed log data, in response to determining that the log data is compressed.

7. The computer-implemented method of claim 1, wherein the log data includes:
details of hardware, software, and network issues experienced by the component, including error statistics and an identification of an inability to send data to another component,
an indication of all devices connected to the component within the network,
an indication of all ports that the devices are on,
an indication of one or more problems with one or more ports, and
an amount of data able to be sent by the component at a predetermined period of time.

8. The computer-implemented method of claim 1, wherein processing the log data further includes:
identifying all details stored within the log data,
formatting all the details stored within the log data to create formatted details, and
storing all the formatted details associated with the log data.

9. The computer-implemented method of claim 1, wherein the component object is created during the processing of the log data, and the component object stores the processed log data.

10. The computer-implemented method of claim 1, further comprising creating the representation of the network, and storing the component object and the representation of the network.

11. The computer-implemented method of claim 1, wherein the representation of the network stores component objects for each component within the network, where the component objects include processed data from the log data of an associated component.

12. The computer-implemented method of claim 1, wherein the device includes a host connected to the network that accesses one or more storage devices via the network.

13. The computer-implemented method of claim 1, wherein the path within the network includes a path between a host and a storage device within the network.

14. The computer-implemented method of claim 1, further comprising:
analyzing stored component objects to identify all interconnections between components within the network; and
determining an end-to-end path within the network between a host and a storage device, utilizing the interconnections.

15. The computer-implemented method of claim 1, wherein the path is presented visually as a series of linked nodes between a host node and one or more storage device nodes.

16. The computer-implemented method of claim 1, further comprising visually identifying all nodes within the path having component objects without processed log data.

17. The computer-implemented method of claim 1, further comprising determining one or more issues within the path, and resolving the one or more issues, utilizing stored component objects for components within the path.

18. A computer program product for determining a storage network path utilizing log data, the computer program product comprising a computer readable storage medium having program instructions embodied therewith, wherein the computer readable storage medium is not a transitory signal per se, the program instructions executable by a processor to cause the processor to perform a method comprising:
- receiving log data from a component of a network, utilizing the processor;
- processing the log data to create processed log data, including parsing the log data utilizing a vendor-specific process in response to determining that the log data is associated with the vendor, utilizing the processor;
- creating, utilizing the processor, a component object, utilizing the processed log data;
- adding, utilizing the processor, the component object to a representation of the network;
- receiving an identification of a device connected to the network, utilizing the processor;
- determining, utilizing the processor, a path within the network that is associated with the device, utilizing the representation of the network including the component object; and
- returning the path, utilizing the processor.

19. The computer program product of claim 18, wherein the component of the network is selected from a group consisting of:
a network switch,
a storage virtualization controller, and
a storage device.

20. A system, comprising:
- a processor; and
- logic integrated with the processor, executable by the processor, or integrated with and executable by the processor, the logic being configured to:
- receive log data from a component of a network;
- process the log data to create processed log data, including parsing the log data utilizing a vendor-specific process in response to determining that the log data is associated with the vendor;
- create a component object, utilizing the processed log data;
- add the component object to a representation of the network;
- receive an identification of a device connected to the network;
- determine a path within the network that is associated with the device, utilizing the representation of the network including the component object; and
- return the path.

* * * * *